United States Patent [19]
Washino

[11] Patent Number: 5,484,963
[45] Date of Patent: Jan. 16, 1996

[54] CERAMIC SUBSTRATE PROVIDED WITH METALLIZED LAYERS FOR CONNECTION WITH CHIP, CIRCUIT BOARD, OR THE LIKE

[75] Inventor: Junichi Washino, Nagoya, Japan

[73] Assignee: NGK Spark Plug Co., Ltd., Nagoya, Japan

[21] Appl. No.: 352,875

[22] Filed: Dec. 9, 1994

[30] Foreign Application Priority Data

Dec. 10, 1993 [JP] Japan ................... 5-341605

[51] Int. Cl.$^6$ ................................. H05K 1/11
[52] U.S. Cl. ............... 174/261; 174/260; 174/250; 361/767; 361/768; 361/760
[58] Field of Search .................. 174/267, 260, 174/261, 250; 361/760, 767, 768

[56] References Cited

U.S. PATENT DOCUMENTS

| | | | |
|---|---|---|---|
| 5,291,375 | 3/1994 | Mukai | 361/760 |
| 5,315,485 | 5/1994 | Magill et al. | 361/767 |
| 5,381,307 | 1/1995 | Hertz et al. | 361/767 |

OTHER PUBLICATIONS

Clark et al., "IBM Multichip Multilayer Ceramic Modules For LSI Chips–Design For Performance And Density", *IEEE Transactions On Components, Hybrids, And Manufacturing Technology*, vol. CHMT–3:89–93, (1980).
A. J. Blodgett, Jr., "A Multilayer Ceramic Multichip Module", *IEEE Transactions On Components, Hybrids, And Manufacturing Technology*, vol. CHMT–3:634–637, (1980).
L. F. Miller, "Controlled Collapse Reflow Chip Joining", *IBM J. Res. Develop.*, vol. 13:225–340, (1969).

*Primary Examiner*—Laura Thomas
*Attorney, Agent, or Firm*—Foley & Lardner

[57] ABSTRACT

A ceramic substrate is provided at a planar side surface thereof with a group of metallized layers which constitute terminals for connection with a mounting article such as an integrated circuit chip. The metallized layers each have an elongated shape such as an oblong or oval shape and are elongated in radial direction extending from a point which is located on the planar side surface of the ceramic substrate and which is substantially at the center of the group of the metallized layers.

18 Claims, 6 Drawing Sheets

CERAMIC SUBSTRATE PROVIDED WITH METALLIZED LAYERS FOR CONNECTION WITH CHIP, CIRCUIT BOARD, OR THE LIKE

BACKGROUND OF THE INVENTION

1. Field of the Invention

The present invention relates in general to ceramic substrates and more specifically a ceramic substrate which is provided with a group of terminals for connection with an IC (integrated circuit) chip or chips by flip chip bonding or the like, or which is provided with a group of terminals which is so-called a ball-grid array or pin-grid array, for connection with an external circuit board.

2. Description of the Prior Art

Figure 6:
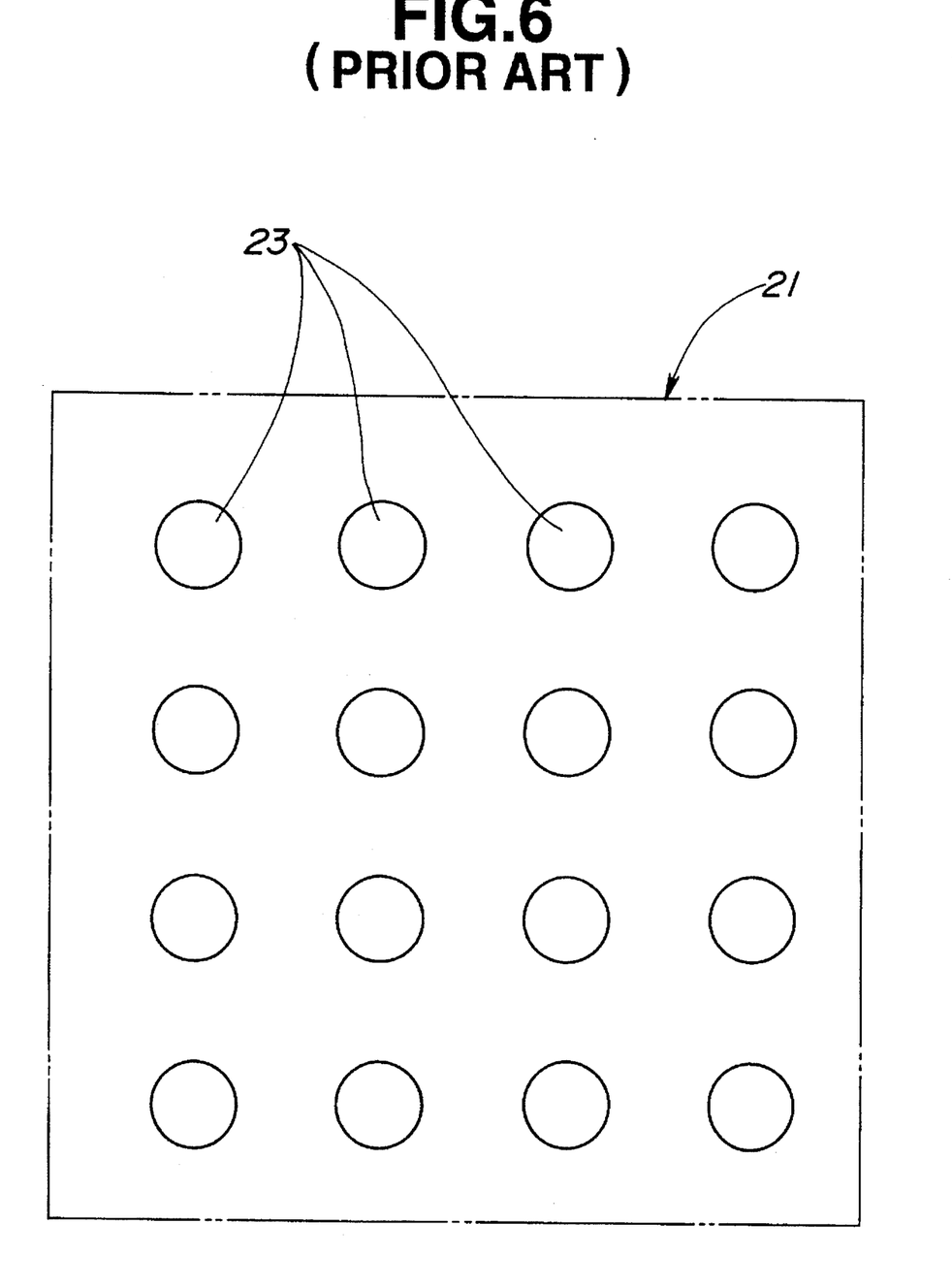
FIG. 6 is a view similar to FIG. 1 but shows a prior art ceramic substrate and metallized pad assembly.

Bonding which is so called face down bonding or flip chip bonding is known for joining the I/O (input/output) terminals of a high density integrated circuit, which high density integrated circuit requires a number of I/O terminals and has arranged on one side thereof the I/O terminals, directly and by fusion to the connecting terminals provided to a ceramic substrate for an IC package for instance. The terminals or pads of the ceramic substrate for mounting thereon such a flip-chip type integrated circuit having I/O terminals or bump contacts on the entire side surface thereof, have heretofore been arranged similarly to the I/O terminals of the integrated circuit chip and formed simply into a circular or square shape. That is, as shown in FIG. 6, the metallized layers 23 formed on a substrate 21 to constitute connecting terminals have, when observed in a plan view, a circular shape and have formed thereon plating layers or solder layers. In installation, the integrated circuit chip is laid upon the substrate in such a manner that the terminals of the integrated circuit chip coincide with the connecting terminals of the substrate, respectively, so that the terminals of the integrated circuit chip are soldered to the terminals of the substrate by fusing the solder pads previously formed on the terminals of the integrated circuit chip or on the terminals of the substrate.

Figure 7:
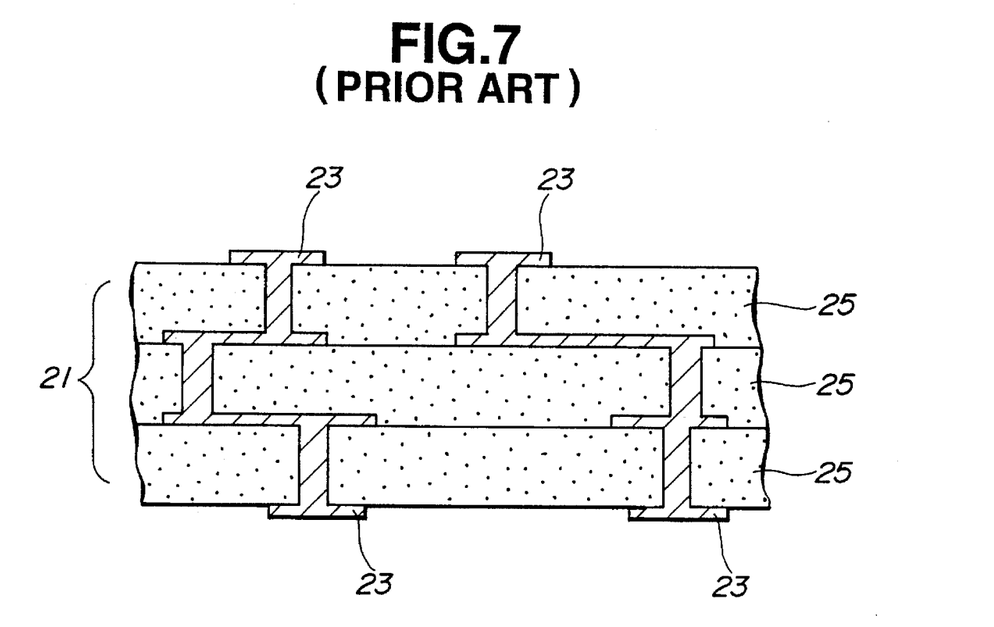
FIG. 7 is a fragmentary sectional view of the prior ceramic substrate and metallized pad assembly of FIG. 6.

Such a ceramic substrate is produced in the following manner. That is, a ceramic substrate having a circuit wiring and via-holes is produced by forming green sheets from ceramic powder such as alumina powder added with organic resin and solvent by a doctor blade method, screen-printing a metallic paste mainly composed of molybdenum and tungsten powder on the green sheets, forming through holes in the green sheets and filling the holes with the metallic paste, and thereafter laminating a plurality of the green sheets and co-firing them. That is, as shown in FIG. 7, a group of metallized pads 23 to serve as connecting terminals on the ceramic substrate 21 are formed by printing a metallic paste on the unfired or unsintered substrate (green sheets 25) in such a manner as to have a predetermined pitch and arrangement (i.e., pattern) that coincide with those of the terminals of the integrated circuit, and firing the paste together with the substrate (co-firing). The ceramic contracts or shrinks during sintering or firing, so the pattern of the metallized layers is determined on consideration of a predetermined rate of firing shrinkange (i.e., rate of shrinkage during sintering) so that the metallized layers of a predetermined size and arrangement (i.e., intervals thereof) are obtained after the sintering.

In the meantime, the rate of firing shrinkage of, for example, an alumina ceramic substrate is generally considered as being about 20% but should theoretically be constant provided that the conditions such as the material and composition are the same. However, it is in effect impossible to control the conditions such as the fineness of the starting material, the conditions of the furnace, the conditions of laminating and pressing the green sheets for obtaining a preform for a substrate, etc. in such a manner as to be completely constant, so a variation or fluctuation of the rate of firing shrinkage occurs though a little. It is generally considered as being a limit to reduce the variation (error) to about ±0.3%. Accordingly, in designing of a substrate, a dimensional allowance is determined by considering a variation of the rate of firing shrinkage at such an amount. Due to this, for example in case a designed pitch of the metallized layers is 5 mm, it can become maximumly 5.015 mm and minimumly 4,985 after sintering of the substrate which are an upper limit and lower limit of the allowance, respectively.

Figure 8:
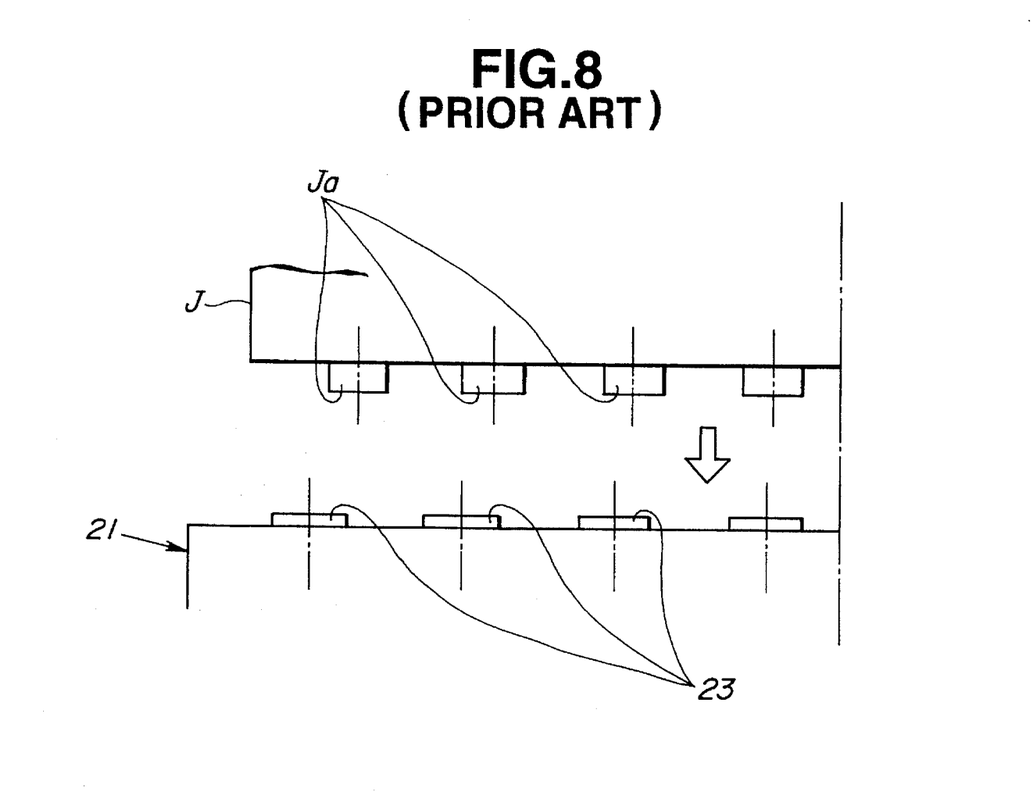
FIG. 8 is a side elevational view of a prior art ceramic substrate and metallized pad assembly and an integrated circuit chip in a condition where the terminals of the integrated circuit chip are laid upon the terminals of the ceramic substrate and metallized pad assembly in which the ceramic substrate is sized to be relatively larger due to a variation of the rate of firing shrinkage of the ceramic substrate toward a negative size.

Accordingly, as shown in FIG. 8, although the pitch "Ja" of the terminals of the integrated circuit chip "J" is just the same as a designed value, there is caused a misalignment (i.e., discrepancy) between the terminals of the substrate 21 and the integrated circuit chip "J" when the pitch of the metallized pads 23 of the substrate 21 is close to an upper limit or lower limit of an allowable range. This means that the more in number and the more in density the terminals of a small size are provided, the more the reliability on the connection of the terminals is decreased, thus causing a large problem in joining of a flip-chip type integrated circuit chip to a substrate. As a means for solving this problem, it will be considered that the metallized layers for constituting the terminals of the substrate, when observed in a plan view, is formed to have a circular shape of a larger diameter on consideration of a variation of the rate of firing shrinkage. However, when this is the case, the gap or space between the metallized layers becomes smaller, thus causing a problem that the rate of occurrence of short circuit defect is increased. Further, the larger the metallized layers for constituting the terminals of the substrate becomes, the more the amount of solder is lacked since, in case the integrated circuit chip has solder layers on the terminals thereof, the solder is caused to spread all over the areas of the terminals of the substrate. Conversely, in case the solder layers are formed on the terminals of the substrate, the amount of the solder of the substrate becomes larger, thus being liable to cause a short circuit defect at the time of joining of the substrate with an integrated circuit chip. Further, to make the metallized layers for constituting connecting terminals large-sized goes against the demand for reducing the distance between the terminals, i.e., the demand for a fine pitch between the terminals for enabling to increase the number of terminals of the integrated circuit chip and make the chip small-sized.

SUMMARY OF THE INVENTION

In accordance with the present invention, there is provided a novel and improved ceramic substrate and metallized pad assembly which comprises a ceramic substrate having a planar side surface, and a group of metallized pads for constituting connecting terminals, formed on the planar side surface of the ceramic substrate, wherein two or more of the metallized pads have an elongated shape and elongate in radial directions extending from a predetermined point on the planar side surface of the ceramic substrate.

According to an aspect of the present invention, the predetermined point on the planar side surface of the ceramic substrate is located substantially at the center of the group of the metallized pad, and the elongated shape is an oblong shape.

According to a further aspect of the present invention, there is provided a novel and improved ceramic substrate and metallized pad assembly which comprises a ceramic substrate having a planar side surface, and a plurality of groups of metallized pads for constituting connecting terminals, formed on the planar side surface of the ceramic substrate, wherein two or more of the metallized pads of at least one of the groups having an elongated shape and elongating in radial directions extending from a predetermined point on the planar side surface of the ceramic substrate.

According to a further aspect of the present invention, there is provided a novel and improved ceramic substrate and metallized pad assembly which comprises a ceramic substrate having a planar side surface, and a group of metallized pads formed on the planar side surface of the ceramic substrate for connection with respective thermals of a mounting article which is to be mounted on the ceramic substrate, wherein the metallized pads, when observed in a plan view, have an elongated shape and elongate in radial directions extending from a point which is located substantially at the center of the group of the metallized pads.

According to a further aspect of the present invention, there is provided a novel and improved ceramic substrate and metallized pad assembly which comprises a ceramic substrate having a planar side surface, and a plurality of groups of metallized pads formed on the planar side surface of the ceramic substrate for connection with terminals of respective mounting articles which are to be mounted on the ceramic substrate, wherein the metallized pads of each of the groups, when observed in a plan view, have an elongated shape and elongate in radial directions extending from a point which is located substantially at the center of each of the groups of the metallized pads.

According to a further aspect of the present invention, there is provided a novel and improved ceramic substrate and metallized pad assembly which comprises a ceramic substrate having a planar side surface, and a group of metallized pads for constituting connecting terminals, formed on the planar side surface of the ceramic substrate, wherein at least two or more of the metallized pads have an elongated shape and are arranged so as to have longitudinal center axes which extend radially from a predetermined point on the planar side surface of the ceramic substrate.

According to a further aspect of the present invention, there is provided a novel and improved ceramic substrate and metallized pad assembly which comprises a ceramic substrate having a planar side surface, and a plurality of groups of metallized pads for constituting connecting terminals, formed on the planar side surface of the ceramic substrate, wherein two or more of the metallized pads of at least one of the groups having an elongated shape and arranged so as to have longitudinal center axes extending radially from a point which is located substantially at the center of the one of the groups of the metallized pads.

According to a further aspect of the present invention, there is provided a novel and improved ceramic substrate and metallized pad assembly which comprises a ceramic substrate having a planar side surface, and a group of metallized pads formed on the planar side surface of the ceramic substrate for connection with a mounting article which is to be mounted on the ceramic substrate, wherein the metallized layers, when observed in a plan view, have an elongated shape and are arranged so as to have longitudinal center axes extending radially from a point which is located substantially at the center of the group of the metallized pads.

According to a further aspect of the present invention, there is provided a novel and improved ceramic substrate and metallized pad assembly which comprises a ceramic substrate having a planar side surface, and a plurality of groups of metallized pads formed on the planar side surface of the ceramic substrate for connection with respective mounting articles which are to be mounted on the ceramic substrate, wherein the metallized pads of each of the groups, when observed in a plan view, having an elongated shape and arranged so as to have longitudinal center axes extending radially from a point which is located substantially at the center of each of the groups of the metallized pads.

According to a further aspect of the present invention, there is provided a novel and improved ceramic substrate and metallized pad assembly which comprises a ceramic substrate having a planar main surface, and a plurality of metallized pads formed on the planar main surface for constituting connecting terminals, wherein two or more of the metallized pads are so shaped as to tolerate positional variations thereof due to a variation of the rate of firing shrinakge of the ceramic substrate.

According to a further aspect of the present invention, there is provided a novel and improved ceramic substrate which has on a planar main surface thereof a plurality of metallized pads for constituting connecting terminals, wherein the metallized pads are elongated in shape so as to tolerate positional variations thereof due to a variation of the rate of firing shrinakge of the ceramic substrate.

The above structure is effective for solving the above noted problems inherent in the prior art device.

It is accordingly an object of the present invention to provide a novel and improved ceramic substrate and metal pad assembly which can tolerate a positional variation of each of the metallized pads for constituting connecting terminals, due to a variation of the rate of firing shrinkage of the ceramic substrate and makes it possible to attain reliable connection with a mounting article such as an integrated circuit chip and an external circuit board.

DETAILED DESCRIPTION OF THE INVENTION

Throughout this description, the terms "metallized layer" and "metallized layers" shall be used interchangeably with the terms "metallized pad" and "metallized pads."

Referring to FIGS. 1 to 4, a ceramic substrate and metallized layer assembly according to an embodiment of the present invention includes a ceramic substrate 1 and a group 2 of metallized layers 3 for constituting connecting terminal's, which are arranged, when observed in a plan view, lengthwise and widthwise or horizontally and vertically of a nearly square surface in such a manner as to have a predetermined pitch "P" so that the group 2 of the metallized layers 3 for connecting terminals is arranged correspondingly to the terminals of a mounting article, e.g., an integrated circuit chip to be joined by flip chip bonding in this embodiment. The metallized layers 3 of the ceramic substrate i each have an oblong shape consisting of a pair of parallel straight sides and a pair of semi-circular sides at the opposite ends of the straight sides as best seen from FIG. 1B, whilst being arranged in such a manner that a direction in which each of the metallized layers 3 is elongated coincides with a radial direction extending from a center "C" of the group 2 of the metallized layers 3. That is, the metallized layers 3 are arranged so as to elongate in radial directions extending from the center "C" of the group 2 of the metallized layers 3 or in other words the metallized layers 3 are arranged so as to have center axes 3b which extend radially from the center "C" of the group 2 of the metallized layers 3. However, in this embodiment, the pitches "P" between the adjacent metallized layers 3 are set so that the designed centers of the terminals of the mounting article (i.e., integrated circuit chip in this embodiment) coincide with the longitudinal centers 3c of each metallized layers 3 after firing (i.e., shrinkage) of the ceramic substrate 1. That is, in this embodiment, a total tolerance for permitting a positional variation of the longitudinal center 3c of each metallized layer 3 is set so as to have a positive tolerance and a negative tolerance of the same amount about a predetermined value, so each metallized layer 3 is so sized as to elongate from the designed center 3c by the same amounts in the opposite directions extending radially toward and away from the center "C" of the group 2 of the metallized layers 3, i.e., so as to elongate inward and outward from the designed center 3c by the same amounts and in the direction of contraction, so as to have the length (major axis) L.

Figure 1A:
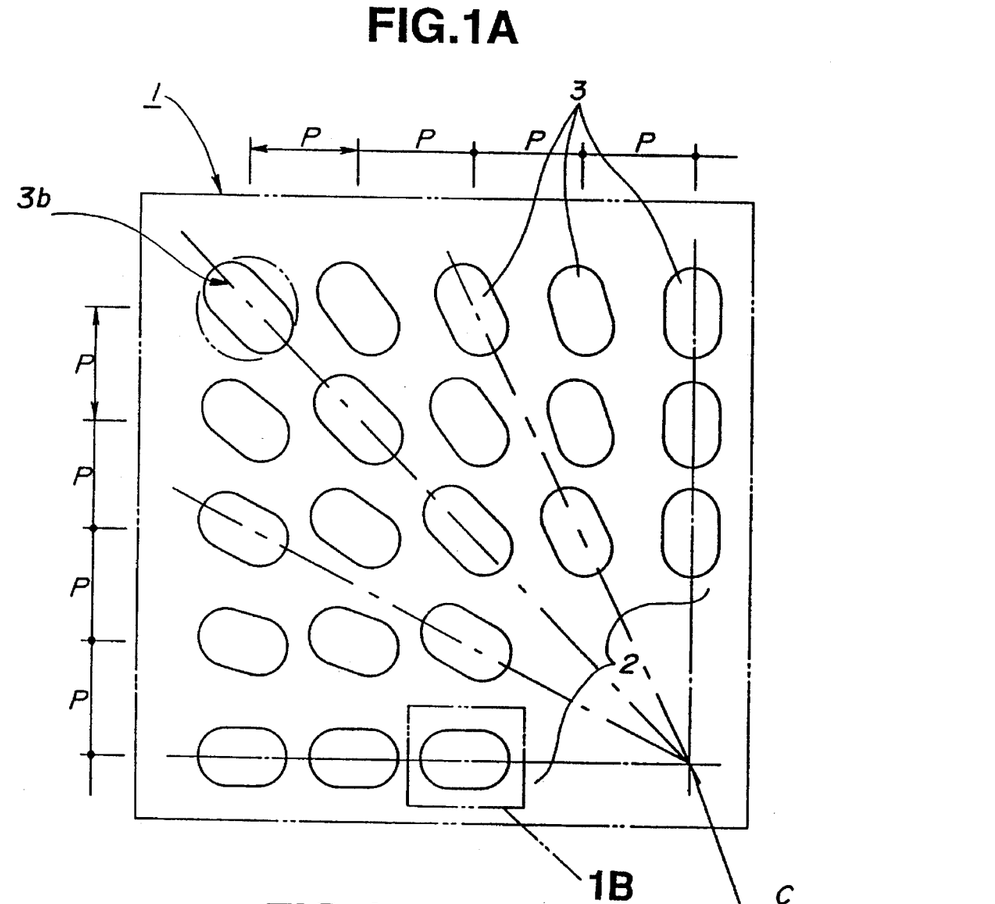
FIG. 1A is a schematic plan view of about one fourth of a ceramic substrate and metallized pad assembly including a center, according to an embodiment of the present invention.
Figure 1B:
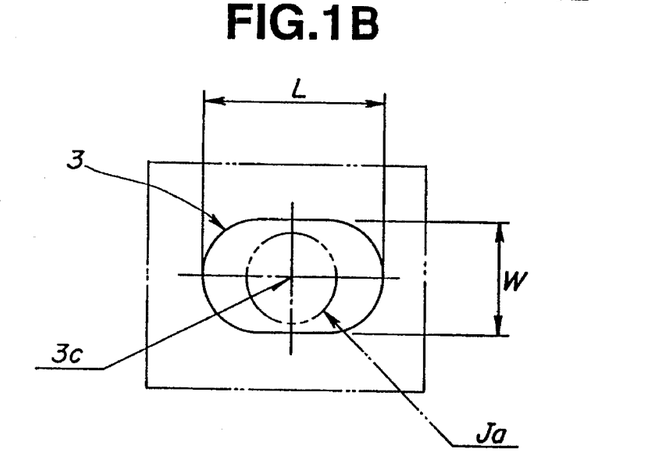
FIG. 1B is an enlarged view of a portion "1B" of FIG. 1A and shows the shape of a metallized pad for constituting a connecting terminal.

According to this embodiment, the metallized layers 3 of the substrate 1 are sized so that the terminals or terminal contact surfaces of the integrated circuit chip can contact at its entirety the respective metallized layers of the substrate 1 when the variation of the firing shrinkage of the substrate 1 is within a tolerance range. In the meantime, the width (minor axis) "W" of each metallized layer 3 of the substrate 1 is sized a little larger than the diameter of each terminal of the integrated circuit chip. In this connection, the ceramic substrate 1 in this embodiment is formed with a metallized wiring by forming, by a doctor blade method, a green sheet from 90% alumina powder added with organic resin, printing a metallic paste composed mainly of tungsten powder on the green sheet, laminating a plurality of printed green sheets and co-firing the laminated sheets. The metallized layers 3 are plated with Ni and Au for thereby constituting terminals 3a.

Figure 2:
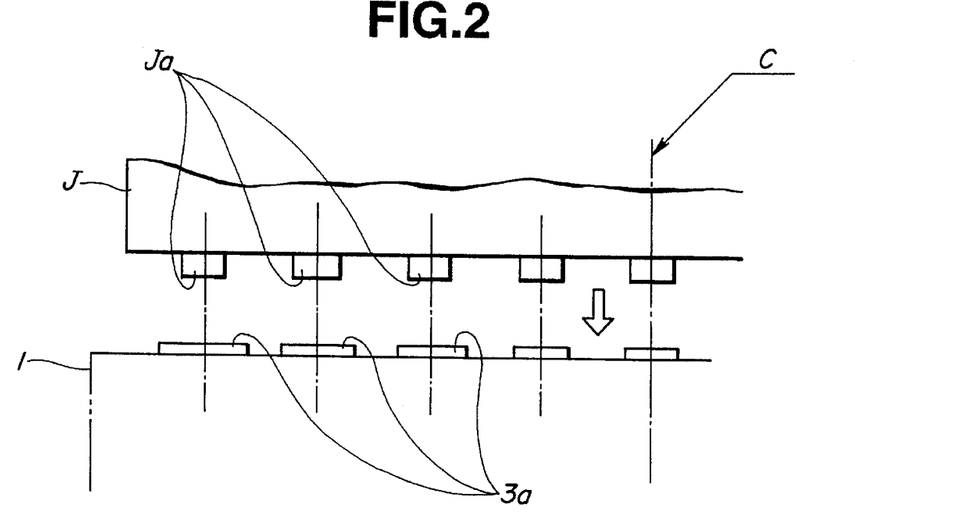
FIG. 2 is a side elevational view for the ceramic substrate and metallized pad assembly of FIG. 1 and an integrated circuit chip in a condition where the terminals of the chip are going to be laid upon the terminals of the ceramic substrate and metallized pad assembly.
Figure 3:
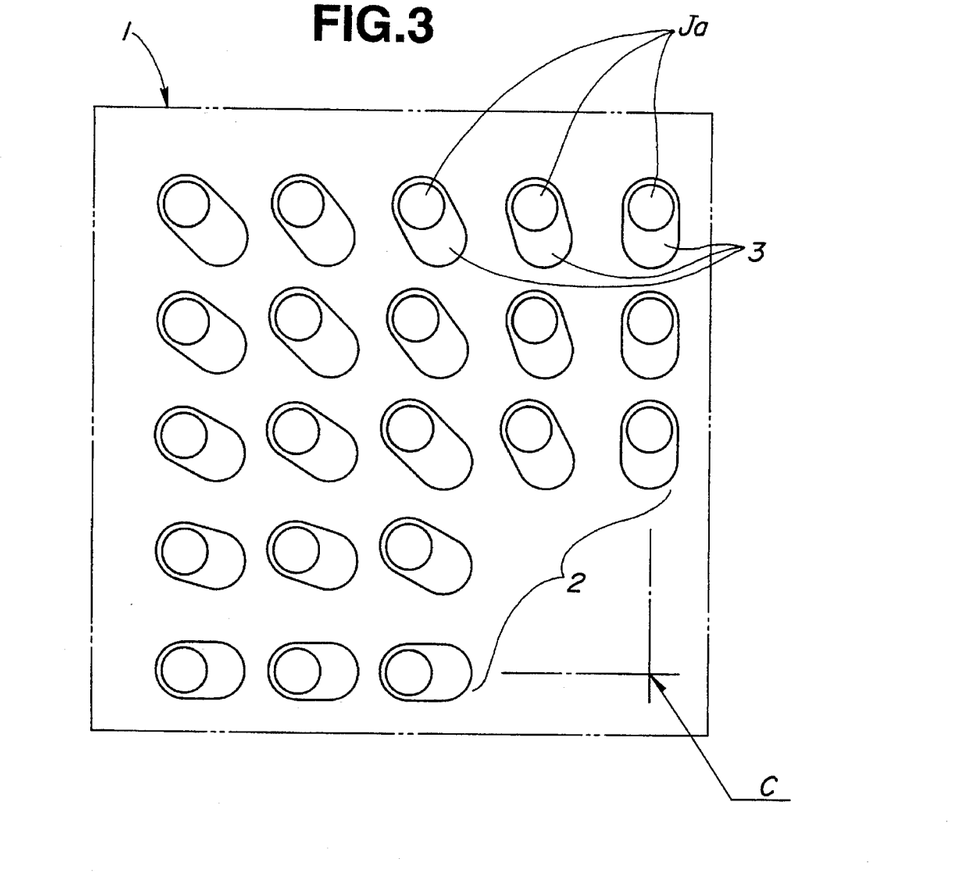
FIG. 3 is a schematic plan view of the ceramic substrate of FIG. 1, which is sized to be relatively smaller due to a variation of the rate of firing shrinkage of the ceramic substrate toward a positive side, in a condition of being brought into contact at the terminals thereof with the respective terminals of an integrated circuit chip.
Figure 4:
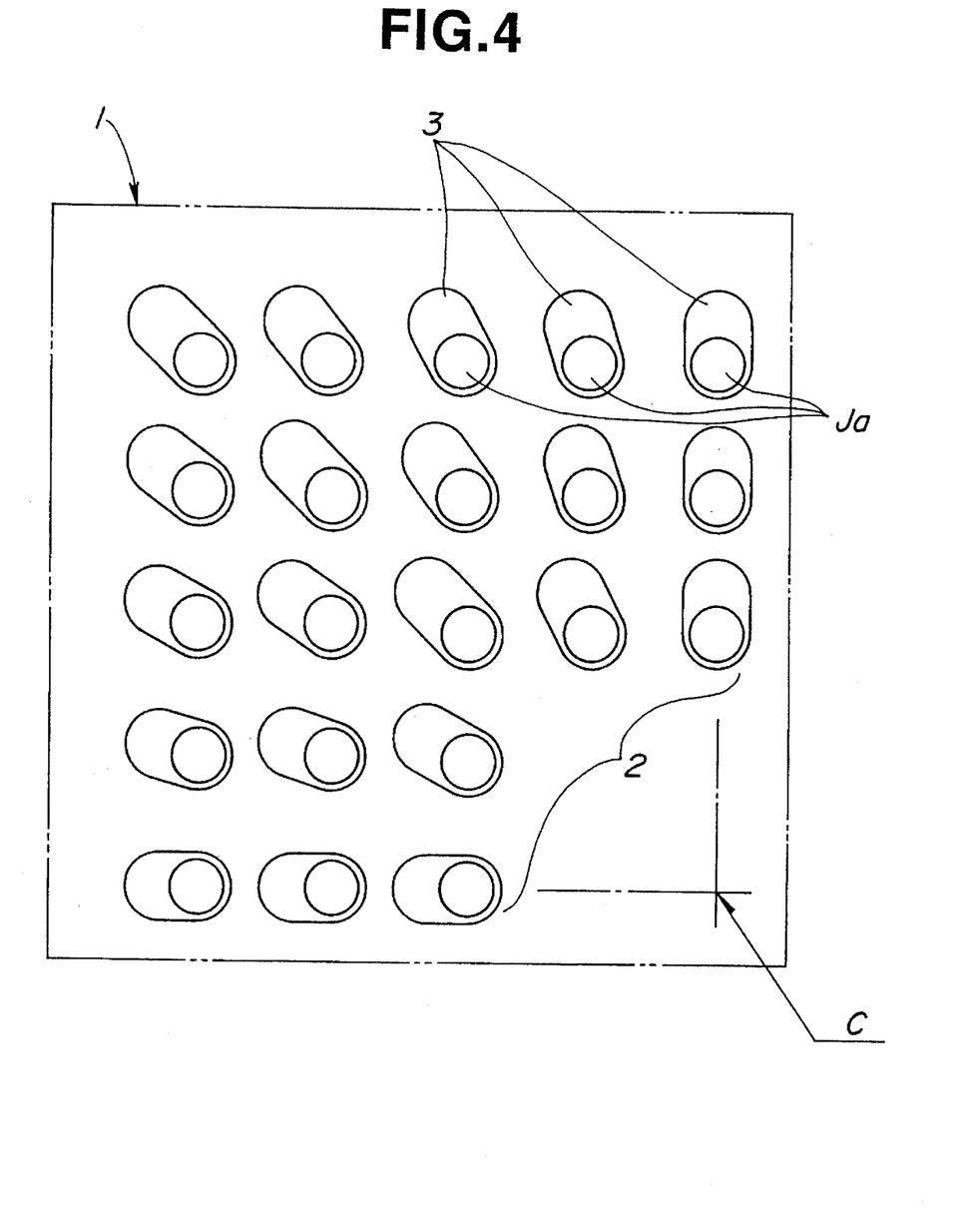
FIG. 4 is a schematic plan view of the ceramic substrate and metallized pad assembly of FIG. 1, which is sized to be relatively larger due to a variation of the rate of firing shrinkage of the ceramic substrate toward a negative side, in a condition of being brought into contact at the terminals thereof with the respective terminals of an integrated circuit chip.

In mounting of the integrated circuit chip "J" on the thus formed substrate 1 of this embodiment, the integrated circuit chip "J" is placed at a predetermined position on the substrate 1 so that the terminals 3a and "J" thereof coincide with each other (refer to FIG. 2). In this instance, when, although the pitch of the terminals "Ja" of the integrated circuit chip "J" is just as designed, the rate of firing shrinkage of the ceramic substrate 1 is on the positive side of a set value (i.e., larger than a set value), that is, the shrinkage is large and a smaller substrate 1 is produced by firing, each terminal "Ja" of the integrated circuit chip "J", as shown in FIG. 3, assumes a position nearer to a longitudinally outer end of each metallized layer 3 than a longitudinally inner end of same. On the contrary, when the rate of firing shrinkage of the substrate 1 is on the negative side of a set value (i.e., smaller than a set value), that is, the shrinkage is small and a larger substrate 1 is produced by firing, each terminal "Ja" of the integrated circuit chip "J", as shown in FIG. 4, assumes a position nearer to the longitudinally inner end of each metallized layer 3 than the longitudinally outer end of same. In any case, each terminal "Ja" of the integrated circuit chip "J" can contact at its entire contact surface with the metallized layer 3, i.e., the terminal 3a of the substrate 1. Accordingly, by soldering, under this condition, the terminals 3a and "Ja" with each other, it becomes possible to tolerate an error of the rate of firing shrinkage, thus making it possible to attain highly reliable electrical connection.

By this invention, the length of the metallized layer for the terminal on the substrate is determined to be a suitable size according to the tolerance range (± value) of the rate of firing shrinkage of the substrate. However, the tolerance range of the rate of firing shrinkage is not necessarily set so that the positive (+) and negative (−) values indicating the tolerance range are the same. Thus, when, for example, the tolerance range of the rate of firing shrinkage is set so that there is no tolerance on the positive side but only on the negative side, it will suffice that the metallized layer for the terminal is made longer a predetermined amount only in the outward direction and arranged so as to elongate in a radial direction. On the contrary, it will suffice that the metallized layer for terminal is made longer a predetermined amount in the inward direction and arranged so as to elongate in a radial direction extending from the center of the group of metallized layers or a predetermined reference point or center. In this invention, it will suffice that each of the metallized layers of the substrate is elongated by a predetermined amount according to the material of the substrate, firing condition, etc. and is arranged so as to elongate in the radial direction extending from the center of the group of the metallized layers or a predetermined reference point. The pitch of the metallized layers constituting a group is determined so as to coincide with the pitch of the terminals of an associated integrated circuit chip or mounting article. In the meantime, it will do that the difference between the longitudinal length of the metallized layer with respect to its shape observed in a plan view (i.e., the length of the major axis) and the length of the same in the direction perpendicular to the longitudinal direction (i.e., width or the length of the minor axis) is determined so as to be proportional to the distance from the center of the group of metallized layers to the point near the center of each metallized layer with respect to its shape observed in a plan view. This is because an error of the rate of firing shrinkage of the ceramic substrate occurs at a substantially constant rate throughout the entirety of the substrate, so an absolute value of the error of the shrinkage is proportional to the distance from the center of the group of the metallized layers. Accordingly, by varying the longitudinal lengths of the metallized layers according to the distances between the center of the group of the metallized layers and the respective centers of the metallized layers, the positional variations of the respective metallized layers due to the error or variation of the rate of firing shrinkage of the ceramic substrate can be tolerated effectively at the respective metallized layers. By this, it becomes possible to make smaller the longitudinal lengths of the metallized layers which are located nearer to the center of the group of the metallized layers.

While, in the above described embodiment, all of the metallized layers of the group are formed into an oblong shape, the metallized layers which are arranged in the place near the center of the group of the metallized layers, which place is least influenced by an error of the rate of firing shrinkage, can be formed into a circular shape though the reliability is lowered a little. Further, according to the present invention, for example, the metallized layers located most outward, i.e, at the outermost peripheral portion, which are the metallized layers arranged on the place where there is no problem or restriction on the space for their arrangements or no short circuit problem, can be, as shown by two-dot chain lines in FIG. 1, formed into any kind of shape other than an oblong shape, for example, a circular shape with which the metallized layers are larger-sized. This is similarly applicable to the metallized layers located at the inward or central portion of the substrate. Accordingly, in the present invention, though it is desirable to form all of the metallized layers of the group into an oblong shape, it is not always necessitated to do so.

While, in the above embodiment, the shape of the metallized layer on the substrate, when observed in a plan view, has been described and shown as being an oblong shape, it is not for the purpose of limitation but can be formed into any elongated shape other than an oblong shape, provided that the elongated shape enables the metallized layers of the substrate and the terminals of the integrated circuit chip, or the like to effectively contact with each other even if a variation of the rate of firing shrinkage of the substrate is occurred, for thereby making it possible to attain highly reliable electrical connection. For example, the elongated shape can be a shape equated to or similar to an oblong shape and furthermore can be an oval or elliptical shape, a rectangular shape or a shape equated to or similar thereto.

Figure 5:
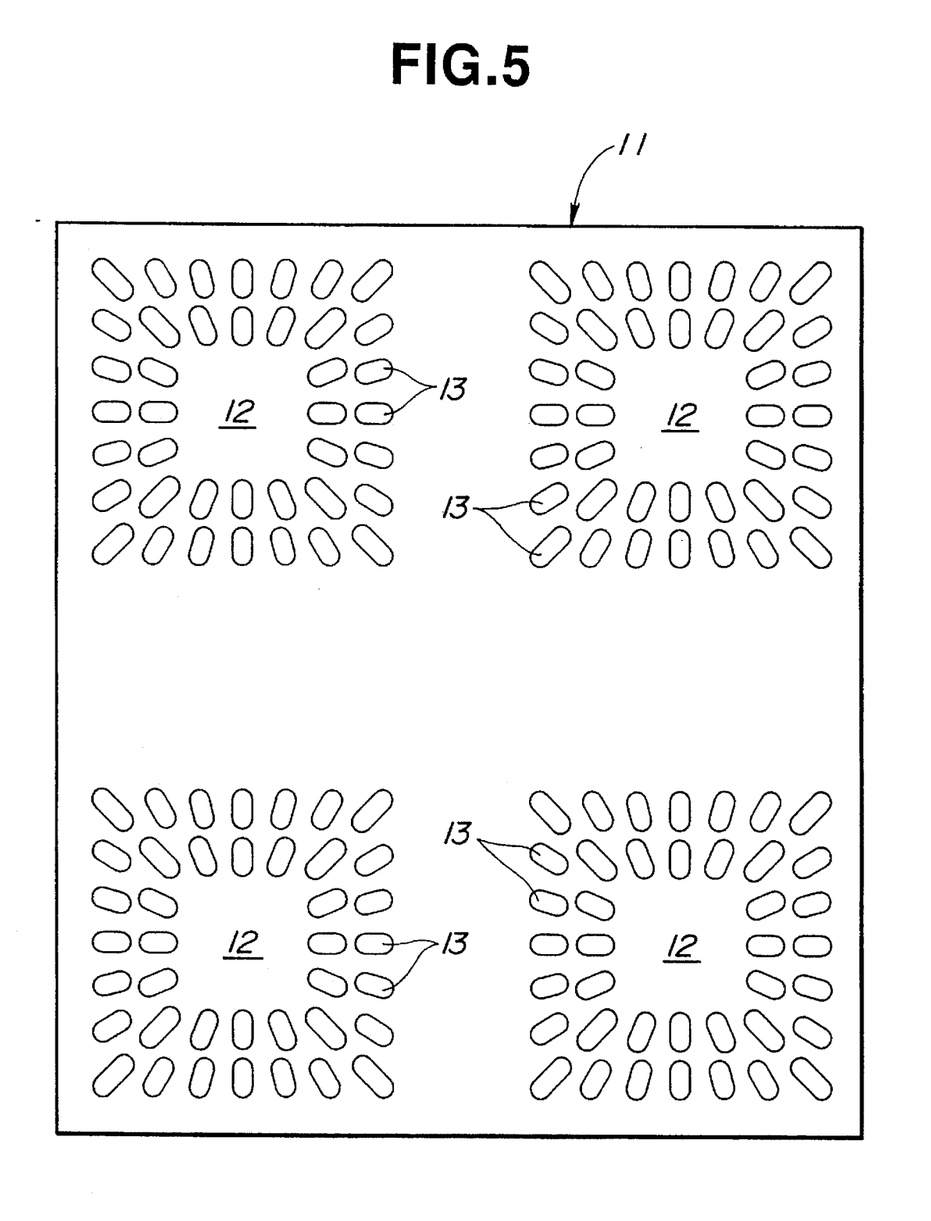
FIG. 5 is a schematic plan view of a ceramic substrate and metallized pad assembly in which plural groups of metallized pads for constituting connecting terminals are formed on a single ceramic substrate according to a further embodiment of the present invention.

While in the above embodiments a group of metallized layers for connecting terminals are arranged on a substrate widthwise and lengthwise so as to form a nearly square shape, this is not for the purpose of limitation but the number of groups (one or a plural) of metallized layers for constituting connecting terminals and the arrangement (grouping) of same can be determined suitably according to the specification and design of the substrate. FIG. 5 shows a single substrate 11 on which four groups 12 of metallized layers 13 are formed. However, in case the number of the groups of the metallized layers is plural, it not always necessary to apply the present invention to all of the groups of the metallized layers but to a necessitated group or groups of the metallized layers selectively. For example, in case the pitch of the terminals is large and an error in the arrangement of terminals can be tolerated by simply making the terminals large-sized, application of the present invention to such a case is not always necessitated.

The ceramic substrate of the present invention can be used in such a case where there is a difficulty in tolerating an error of the rate of firing shrinkage by a connecting method, and can be suitably applied to a ceramic substrate for mounting thereon an electronic device having at the entirety of its main surface and in high density numerous input/output terminals, such as a flip-chip type integrated circuit chip. Further, the present invention cap be applied to such a case where TAB (tape-automated bonding) is used. In this connection, while the metallized layers for terminals have been described in the above embodiments as being formed from a metallic paste containing tungsten as a main component, they can otherwise be formed from a metallic paste containing molybdenum, copper, silver, etc. as main components. Further, the material for the ceramic substrate can be, other than alumina, glass ceramic, AlN (aluminum nitride), mullite, etc.

In the meantime, the present invention can be applied to pin joining metallized layers of a pin-grid array (PGA) type ceramic package main body. By forming the metallized layer into an oblong shape or the like elongated shape with respect to the shape observed in a plan view whilst aligning the longitudinal direction of the metallized layer substantially with the radial direction passing through a predetermined center of the group of the metallized layers, it becomes possible to improve the reliability on connection with the pins. The present invention can be applied similarly to a ball-grid array (BGA) type ceramic package main body.

From the foregoing, it will be understood that by the ceramic substrate according to the present invention each metallized layer in a group of metallized layers for connecting terminals is formed into an elongated shape and is arranged so as to elongate radially of a predetermined center such that an error or variation of the rate of firing shrinkage of a ceramic substrate can be tolerated, thus making it possible for the metallized layers of the substrate to attain high reliable connection with terminals of an integrated circuit chip or the like electronic devices.

What is claimed is:

1. A ceramic substrate and metallized pad assembly comprising:

a ceramic substrate having a planar side surface; and a group of metallized pads for constituting connecting terminals, formed on said planar side surface of said ceramic substrate;

at least two or more of said metallized pads having an elongated shape and elongating in radial directions extending from a predetermined point on said planar side surface of said ceramic substrate.

2. An assembly according to claim 1, wherein said predetermined point on said planar side surface of said ceramic substrate is located substantially at the center of said group of said metallized pads.

3. An assembly according to claim 1, wherein said elongated shape is an oblong shape.

4. An assembly according to claim 1, wherein each of said two or more of said metallized pads is elongated in such a manner as to provide a longitudinal center thereof with a negative tolerance and a positive tolerance of the same amount for tolerating a positional variation of said longitudinal center due to a variation of the rate of firing shrinkage of said ceramic substrate.

5. An assembly according to claim 1, wherein each of said two or more of said metallized pads is elongated in such a manner as to provide a longitudinal center thereof with only a negative tolerance for tolerating a positional variation of said longitudinal center due to a variation of the rate of firing shrinkage of said ceramic substrate.

6. An assembly according to claim 1, wherein each of said two or more of said metallized pads is elongated in such a manner as to provide a longitudinal center thereof with only a positive tolerance for tolerating a positional variation of said longitudinal center due to a variation of the rate of firing shrinkage of said ceramic substrate.

7. A ceramic substrate and metallized pad assembly comprising:

a ceramic substrate having a planar side surface; and a plurality of groups of metallized pads for constituting connecting terminals, formed on said planar side surface of said ceramic substrate;

two or more of said metallized pads of at least one of said groups having an elongated shape and elongating in radial directions extending from a predetermined point on said planar side surface of said ceramic substrate.

8. An assembly according to claim 7, wherein said predetermined point on said planar side surface of said ceramic substrate is located substantially at the center of said one of said groups of said metallized pads.

9. A ceramic substrate and metallized pad assembly comprising:

a ceramic substrate having a planar side surface; and a group of metallized pads formed on said planar side surface of said ceramic substrate for connection with terminals of a mounting article which is to be mounted on said ceramic substrate;

said metallized pads, when observed in a plan view, having an elongated shape and elongating in radial directions extending from a point which is located substantially at the center of said group of said metallized pads.

10. An assembly according to claim 9, wherein said metallized pads have varying longitudinal lengths which increase in accordance with increase of the distances between said center of said group of said metallized pads and respective centers of said metallized pads.

11. An assembly according to claim 9, wherein the difference between a longitudinal length and a widthwise length perpendicular to said longitudinal length, of each of said metallized pads is determined so as to be proportional to the distance from the center of said group of said metallized pads to a point near the center of each of said metallized pad with respect to its shape observed in a plan view.

12. A ceramic substrate and metallized pad assembly comprising:

a ceramic substrate having a planar side surface; and a plurality of groups of metallized pads formed on said planar side surface of said ceramic substrate for connection with terminals of respective mounting articles which are to be mounted on said ceramic substrate;

said metallized pads of each of said groups, when observed in a plan view, having an elongated shape and elongating in radial directions extending from a point which is located substantially at the center of each of said groups of said metallized pads.

13. A ceramic substrate and metallized pad assembly comprising:

a ceramic substrate having a planar side surface; and a group of metallized pads for constituting connecting terminals, formed on said planar side surface of said ceramic substrate;

at least two or more of said metallized pads having an elongated shape and arranged so as to have longitudinal center axes which extend radially from a predetermined point on said planar side surface of said ceramic substrate.

14. An assembly according to claim 13, wherein said predetermined point on said planar side surface of said ceramic substrate is located substantially at the center of said group of said metallized pads.

15. An assembly according to claim 13, wherein said elongated shape is an oblong shape.

16. A ceramic substrate and metallized pad assembly comprising:

a ceramic substrate having a planar side surface; and a plurality of groups of metallized pads for constituting connecting terminals, formed on said planar side surface of said ceramic substrate;

two or more of said metallized pads of at least one of said groups having an elongated shape and arranged so as to have longitudinal center axes extending radially from a point which is located substantially at the center of said one of said groups of said metallized pads.

17. A ceramic substrate and metallized pad assembly comprising:

a ceramic substrate having a planar side surface; and a group of metallized pads formed on said planar side surface of said ceramic substrate for connection with a mounting article which is to be mounted on said ceramic substrate;

said metallized pads, when observed in a plan view, having an elongated shape and arranged so as to have longitudinal center axes extending radially from a point which is located substantially at the center of said group of said metallized pads.

18. A ceramic substrate and metallized pad assembly comprising:

a ceramic substrate having a planar side surface; and a plurality of groups of metallized pads formed on said planar side surface of said ceramic substrate for connection with respective mounting articles which are to be mounted on said ceramic substrate;

said metallized pads of each of said groups, when observed in a plan view, having an elongated shape and arranged so as to have longitudinal center axes extending radially from a point which is located substantially at the center of each of said groups of said metallized pads.

* * * * *